United States Patent
Le Garrec et al.

(10) Patent No.: US 9,881,247 B2
(45) Date of Patent: Jan. 30, 2018

(54) METHOD FOR PRODUCING A SMART CARD HAVING A PLURALITY OF COMPONENTS AND CARD OBTAINED IN THIS WAY

(71) Applicant: OBERTHUR TECHNOLOGIES, Colombes (FR)

(72) Inventors: Loic Le Garrec, Colombes (FR); Philippe Gac, Colombes (FR)

(73) Assignee: OBERTHUR TECHNOLOGIES, Colombes (FR)

( * ) Notice: Subject to any disclaimer, the term of this patent is extended or adjusted under 35 U.S.C. 154(b) by 69 days.

(21) Appl. No.: 14/438,886

(22) PCT Filed: Oct. 29, 2013

(86) PCT No.: PCT/FR2013/052581
§ 371 (c)(1),
(2) Date: Apr. 28, 2015

(87) PCT Pub. No.: WO2014/068240
PCT Pub. Date: May 8, 2014

(65) Prior Publication Data
US 2015/0317554 A1   Nov. 5, 2015

(30) Foreign Application Priority Data
Oct. 30, 2012 (FR) ..................................... 12 60355

(51) Int. Cl.
*G06K 19/07*    (2006.01)
*G06K 19/077*   (2006.01)

(52) U.S. Cl.
CPC ..... *G06K 19/072* (2013.01); *G06K 19/07701* (2013.01); *G06K 19/07707* (2013.01);
(Continued)

(58) Field of Classification Search
CPC ....... H01L 2924/00; H01L 2924/00014; H01L 2224/48227; H01L 2224/48095;
(Continued)

(56) References Cited

U.S. PATENT DOCUMENTS

2006/0237542 A1   10/2006 Launay et al.
2010/0177486 A1   7/2010 Droz
(Continued)

FOREIGN PATENT DOCUMENTS

DE   10 2004 011960 A1   9/2005
EP   1 556 832 B1        12/2006
(Continued)

OTHER PUBLICATIONS

International Search Report, dated Jan. 31, 2014, from corresponding PCT application.

*Primary Examiner* — Sonji Johnson
(74) *Attorney, Agent, or Firm* — Young & Thompson

(57) ABSTRACT

A method is provided for producing a smart card including at least one chip and another electronic component having a face accessible from the outside. The method includes: forming a card body having two opposing faces and in which at least two recesses are formed, one being a through-recess extending from one of the faces to the other, forming a first module including the chip and forming a second module separate from the first module and including the other electronic component, the second module including a support to which the component is secured opposite the face that must be accessible, securing the second module in the through-recess from the face of the body that is opposite the face through which the face of the component must be accessible, via a shoulder in the through-recess, and securing the first module in the other recess.

17 Claims, 1 Drawing Sheet

(52) U.S. Cl.
CPC . *G06K 19/07747* (2013.01); *G06K 19/07749* (2013.01); *H01L 2224/48095* (2013.01)

(58) Field of Classification Search
CPC ........... G06K 19/072; G06K 19/07749; G06K 19/07747; G06K 19/07707; G06K 19/07701
See application file for complete search history.

(56) References Cited

U.S. PATENT DOCUMENTS

2010/0252639 A1   10/2010   Schiller et al.
2013/0148309 A1   6/2013    Fidalgo et al.

FOREIGN PATENT DOCUMENTS

| | | |
|---|---|---|
| EP | 2 068 274 A1 | 6/2009 |
| EP | 2 330 541 A1 | 6/2011 |
| EP | 2 390 824 A1 | 11/2011 |
| FR | 2 776 796 A1 | 10/1999 |

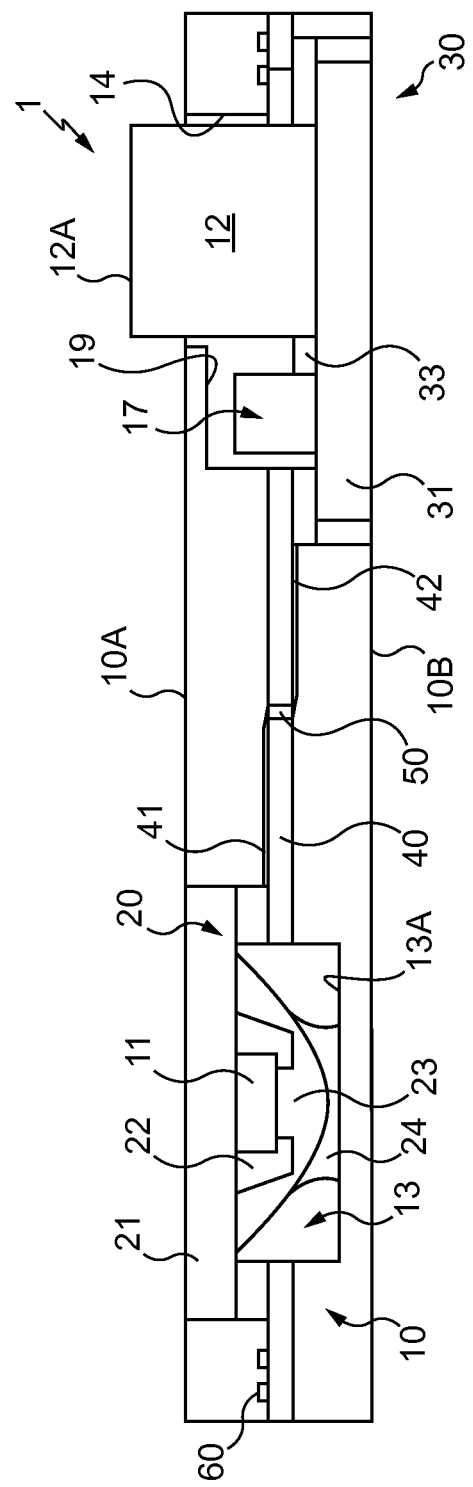

METHOD FOR PRODUCING A SMART CARD HAVING A PLURALITY OF COMPONENTS AND CARD OBTAINED IN THIS WAY

BACKGROUND OF THE INVENTION

Field of the Invention

The invention relates to a method for producing a smart card having a plurality of components and a card obtained in this way.

Description of the Related Art

As is known, smart cards are formed of a body the format of which defines the format of the card and at least one electronic component; in practice there is often at least one integrated circuit (a microprocessor in practice), but there may also be an antenna, and/or a fingerprint reader, and/or a display, and/or a battery, with (or without) external contacts, etc.

The space constraints that apply to such cards are notably set by standards; thus the thickness of such cards, according to ISO 7816 and ISO 14443 standards, must not exceed 760+/−80 microns, or a maximum of 840 microns.

When seeking to integrate components within a card, it is first necessary to electrically power these components (possibly using a battery, but another option is to collect energy from the ambient electromagnetic field, typically by means of an antenna), but also to manage to integrate these components into the aforesaid thickness while creating the necessary connections for cooperation between at least some of the components.

As for producing such cards, two broad categories are known, according to whether at least one of the components is integrated after formation of the card body, or whether the body is assembled by lamination between two layers of plastic material, after the components and the connections therebetween have been integrated into it.

Thus, document FR2776796 describes a method for producing smart cards comprising an interface for communicating with the outside and at least one electronic component emerging at the surface in which connections are established between the interface and the component within an assembly that is intercalated between two wafers, having openings with appropriate shapes and locations, which are laminated so as to enclose said assembly between these wafers. The communication interface is, for example, an antenna connected to an integrated circuit mounted on a contact pad within a module; the connection between the components may be made by means of wires or conductive tracks formed on flexible films; the components may be attached onto a film on different faces; the film with the components is intercalated between two wafers defining the faces of the future card; there may be components emerging at the surface on opposite sides of the card, e.g. external contacts surfacing on one face while the other component surfaces on the other face.

Document EP1556832 discloses a smart card comprising an emerging component and a method of production, according to which a microcircuit, the emerging component and external contacts form part of a subassembly comprising a support film bearing on one inner face the microcircuit and at least the emerging component and bearing on one outer face the external contacts. Such an assembly is mounted in a multiple emerging cavity formed at a time when the card body is already completely made (or almost completely, finishing operations may be performed later).

Document US2010/0177486 describes an electronic device comprising a visible electronic element connected to an internal module in the card, and a method of manufacturing such a card. The visible component and the internal module (in practice optional) are connected by soldering, at least the component being linked to an adhesive film; the case is envisaged of two visible devices on opposite faces, without any connection therebetween.

Document US2010/0252639 discloses a display module and a data storage medium in which a display module is inserted. A cavity is formed in the card body emerging onto both faces of a smart card, in which an assembly may be attached comprising, on the one side, contacts and, on the other, the display device; this assembly further comprises at least one integrated circuit and optionally an input device; the various elements are carried by a flexible layer e.g. provided with conductive tracks; connections are made by means of wires. The card body may comprise a battery or an antenna, which advantageously have electrical contact areas on a shoulder formed in the wall of the cavity. In a variant, the various elements are distributed over two independent layers, electrically connected with each other; one of these layers may be formed so as to carry, on the one side, certain elements and, on the other, other elements.

Document EP2390824 discloses a method for producing a multifunctional module and a card comprising such a module. Just as in document US2010/0252639, a card body comprises a cavity emerging onto both faces of the body, and various elements are distributed on a flexible layer so as to be able to present their main faces oriented in two opposite directions; it is envisaged that these elements may be distributed on both faces of such a flexible layer; the wall of the cavity has shoulders facilitating the attachment of the assembly formed by the elements and their support layer.

It may be noted that, when it is envisaged that a same card body carries a plurality of electronic components including a chip and at least one other component presenting a face that must be accessible from one face (either to make a display visible, or to enable an action of a user), either these components are integrated in a same assembly then attached to a previously formed card body, or these components are placed between the outer layers of the body, before this body is then formed by lamination; furthermore, when the components are integrated into a same assembly which is then attached to a previously formed card body, either this assembly is attached in a cavity extending over a large fraction of the surface of one of the faces of the body (which may significantly weaken the card body), or this assembly is attached in a through-cavity (extending from one face to the other of the body), which limits the acceptable thicknesses for these components.

BRIEF SUMMARY OF THE INVENTION

The object of the invention is to enable the integration, in a smart card, of a chip and at least one other electronic component presenting a face that must be accessible from the outside and which is more voluminous than in the known solutions, advantageously connected to the card's chip.

It thus provides a method for producing a smart card comprising at least one such chip and at least one other electronic component having a face that must be accessible from the outside, according to which a card body is formed having two opposing faces and in which at least two cavities are formed one of which is a through-cavity, extending from one of the faces to the other, a first module is formed comprising a chip and a second module is formed separate from the first module and comprising the other electronic component, this second module comprising a support to which the component is attached opposite the face thereof that must be accessible, the second module is attached in the through-cavity from the face of the body which is opposite the face through which the face of the component must be accessible from the outside by means of a shoulder that comprises the through-cavity, and the first module is attached in the other cavity.

Thus the invention provides for mounting the chip and at least one other component within two separate modules, allowing said another component to have larger dimensions than those provided in the known solutions (its thickness is no longer limited by the proximity of the chip); moreover, this other component is attached in the body from a side opposite that through which the component must be accessible from the outside, allowing the support of this second module to have a section (parallel to the faces of the body) larger than that of the component, which helps facilitate the attachment of the component in the body, as well as its connection to another component.

Advantageously, the card body is formed by integrating therein, between the faces of the future card body, an inlay comprising conductive tracks, each of the cavities comprising a shoulder surfacing on one face of this inlay, and each of the modules is attached by establishing electrical connections between these modules and this inlay. Thus this inlay can be used to establish optional connections that may be desired between said other component and the chip and/or another component that the card comprises.

According to another advantageous feature, the two modules are attached by establishing said electrical connections on opposite faces of said inlay. This has the particular advantage of allowing the module comprising the chip and the face of the component that must be accessible from the outside to be on a same face of the card.

According to another advantageous feature, the body is formed by forming an antenna on the inlay. This can be used for exchanges between the card and the outside, or even for drawing from the outside environment sufficient energy for the operation of the component(s) that the card comprises.

According to yet another advantageous feature of the invention, said other component is selected from the group comprising devices for visual display, sound generation (such as buzzers sometimes called pagers, tremblers or noisemakers, for example) or even sound input, and fingerprint readers. Indeed these are components that can be used for many new smart card applications.

The invention also provides a card obtained by the aforementioned method, i.e. a smart card comprising a card body having two opposing faces and in which at least two cavities are formed one of which is a through-cavity, extending from one of these faces to the other, a first module comprising a chip attached in one of the cavities and a second module comprising another electronic component having a face that must be accessible from the outside and a support to which this component is attached opposite the face thereof that must be accessible, this second module being attached in the through-cavity by means of a shoulder such that this second module has been introduced into this through-cavity from the face opposite that where said face of the component must be accessible.

By analogy with the above regarding the method, it is advantageous that the card body integrates, between the faces of the card body, an inlay comprising conductive tracks, each of the cavities comprising a shoulder surfacing on one face of this inlay, each of the modules being attached to these shoulders so as to establish electrical connections between these modules and this inlay.

Similarly, advantageously, the modules are attached to the inlay by establishing said electrical connections on opposite faces of said inlay.

Equally advantageously, the inlay comprises an antenna.

Advantageously, said other component is selected from the group comprising display devices, sound generation or input devices and fingerprint readers.

BRIEF DESCRIPTION OF THE DRAWINGS

Objects, features and advantages of the invention emerge from the following description given as an illustrative, non-restrictive example in relation to the attached drawing in which FIG. 1 is a sectional view of an example of embodiment of a smart card in conformity with the invention.

DETAILED DESCRIPTION OF THE PREFERRED EMBODIMENTS

This FIG. 1 represents a smart card 1 comprising, in a card body denoted by 10 as a whole, an integrated circuit 11 normally referred to as a 'chip' and another electronic component 12 having a face 12A that must be accessible from the outside.

This card body 10 has two opposing faces 10A and 10B and two cavities are formed therein.

A first cavity, denoted here by 13, is blind, i.e. it emerges onto one of the faces, here the upper face 10A, while having a bottom 13A. A module denoted by 20 is attached in this cavity, comprising a support 21 and an integrated circuit 11. This support has an upper face, denoted as the outer face, which runs along the upper face of the card body and a lower face, denoted as the inner face, to which the integrated circuit 11 is added. This module may be a conventional module, with connecting wires 22 connected to electrical contact areas arranged on the inner face of the support and a resin mass 23 coating this integrated circuit and the connecting wires; in a variant not represented the integrated circuit is mounted head-to-tail, i.e. its electrical contact areas are arranged facing the support (which is provided with contact areas arranged opposite thereto), in which case it is not necessary to provide connecting wires. This module is attached to the cavity in any suitable known manner; in the example represented here, this attachment is carried out at the periphery of the support, on a shoulder formed around the cavity 13; however, this module may also be attached by means of a second resin mass 24 (optional) adhering to the resin mass 23 and to one part of the wall of the cavity; indeed, in order to confer some flexibility on the complete card, it is desirable that the module 20 does not adhere to the whole wall of the cavity (this wall concept encompasses not only the lateral wall of the cavity but also the bottom thereof). In a variant not represented, it is the resin mass that encompasses the integrated circuit and the connecting wires which itself ensures an attachment of the module to a portion of the wall of the cavity, in addition to or instead of the aforementioned attachment of the periphery of the support.

This support may comprise, on its outer face electrical contact pads (not represented) allowing a contact connection with an external device such as a card reader.

The other cavity, denoted by 14, is a through-cavity, i.e. it extends from one face to the other. In this cavity a second module denoted by 30 is attached comprising a support 31 and the electronic component 12 having the face 12A that must be accessible from the outside. This support 31 has a lower face, oriented downward, i.e. toward the outside of the card, and an inner face to which the component 12 is attached, opposite the face 12A thereof. This cavity comprises a shoulder oriented downward so as to allow an attachment of the second module via the periphery of the inner face of this module. Indeed, this second module is introduced into the through-cavity via the lower face, i.e. via the face of the body which is opposite the face via which the component must be accessible from the outside. Of course, the component may also itself be attached to the cavity 14.

In a simplified version, the integrated circuit and the component may be independent and not require connection to each other; in such a case, the cavity 13 may not have a shoulder (notably when the attachment is provided by a resin mass such as the mass 14).

Advantageously, the two modules are electrically connected to each other. To do this, the card body advantageously includes, at an intermediate level between the faces 10A and 10B, an inlay 40 comprising conductive tracks such as those designated by references 41 and 42. This inlay running along the shoulders formed in each of the cavities (these shoulders are thus formed by the inlay), i.e. it is to the inlay that the supports of the various modules are attached and electrically connected, and it is through this inlay that these modules are electrically connected to each other.

In the example represented, where the first cavity emerges upward, and where the face 12A is also upwardly oriented, the modules are connected to the inlay on opposite faces thereof, that is, the module 20 is attached and connected to the inlay via the upper face thereof while the second module 30 is attached and connected to the inlay via the lower face thereof. In a way known in itself, metalized holes such as the hole 50 allow an electrical connection between tracks on each side of the inlay.

In the example represented here, the first module contains only a single electronic element, while the second module comprises not only the component of which one face must be accessible from the outside but also another component, here a microcontroller 17 being used to control the component 12. The various components contained by this second module are connected to each other, and to the inlay where it exists; these connections may be made via conductive tracks formed on the inner face of the support 31, or via connecting wires, or via connection areas 33 obtained by remelting a solder material. The second cavity is formed so as to house the assembly of the second module; thus, in the example represented, the cavity 14 has at the level of the upper face 10A of the body, a section scarcely greater than the section of the component 12 at this level, but presents a widening 19 dimensioned for housing the component 17.

Advantageously, the inlay carries an antenna of which the strands are denoted by 60; this antenna is here formed by conductive tracks formed on the upper face of the inlay; this antenna can be used for data exchanges with the outside without needing any contact with an external reader and/or allowing energy to be captured from the ambient electromagnetic field. In a variant not represented, the smart card may comprise a battery.

The component(s) carried by the second module may be of varied natures. Advantageously these are a fingerprint sensor, a device for sound generation (such as a buzzer, sometimes called a pager, noisemaker or trembler) or sound input or a display device.

It is understood that the card described by way of example comprises two separate modules, but that the above extends to the case of a larger number of modules, connected or not connected to each other.

It is understood that a smart card an example of which is described above is produced according to the following steps:

a card body 10 is formed having two opposing faces 10A and 10B and in which are formed at least two cavities one of which, 14, is a through-cavity extending from one of the faces to the other, a first module 20 is formed comprising a chip 11 and a second module 30 is formed separate from the first module and comprising the other electronic component 12, this second module comprising a support 31 to which the component is attached opposite the face thereof that must be accessible, the second module is attached in the through-cavity from the face of the body, 10B, which is opposite the face, 10A, through which the face of the component must be accessible from the outside by means of a shoulder that comprises the through-cavity 14, and the first module 20 is attached in the other cavity 13.

It may be noted that the inlay is here arranged substantially midway between the faces 10A and 10B, so that the supports 21 and 31 have thicknesses close to half the thickness of the card; however, in a variant not represented, the inlay may have a sinuous shape, so as to be located at the appropriate levels between the faces, at the location of each of the modules.

The card body has, for example, the format known under the standardized designation of ID-1 or even the format ID-000, with a thickness of 760+/−80 microns (according to the standard ISO 7816), but the preceding teachings apply to any other type of format, including any other range of thicknesses.

The invention claimed is:

1. A method for producing a smart card including at least one chip and at least one other electronic component having a face that is accessible from the outside of the smart card, the method comprising:

forming a card body having two opposing faces defining two opposing external faces of the smart card and in which at least two cavities are formed, one of the cavities being a through-cavity extending from one of the faces to the other and provided with a shoulder and another one of the cavities being a blind cavity extending from one of the two opposing faces;

forming a first module comprising a chip;

forming a second module separate from the first module and comprising the other electronic component, the second module comprising a support having an internal face to which the electronic component is attached opposite the face thereof that is accessible and an external face opposite the internal face;

after forming the card body and the second module,
introducing the second module in the through-cavity from the face of the card body which is opposite the face of the card body through which the face of the component is accessible from the outside towards the shoulder of the through-cavity, and attaching the second module to the card body by the shoulder, the external face of the support being part of the external face of the smart card defined by the face of the card body that is opposite the face of the card body through which the face of the component is accessible from the outside; and after forming the card body and the first module, attaching the first module in the blind cavity.

2. The method as claimed in claim 1, wherein the card body is formed by integrating therein, between the opposing faces of the card body, an inlay comprising conductive tracks, each of the cavities comprising a shoulder surfacing on one face of the inlay, and wherein the attaching the first module and the attaching the second module each comprise establishing electrical connections between the respective modules and the inlay.

3. The method as claimed in claim 2, wherein the attaching the first module and the attaching the second module each comprise establishing said electrical connections on opposite faces of said inlay.

4. The method as claimed in claim 3, wherein the forming the card comprises forming an antenna on the inlay.

5. The method as claimed in claim 2, wherein the forming the card comprises forming an antenna on the inlay.

6. The method as claimed in claim 2, wherein said other component is selected from the group comprising display devices, sound generation devices, sound input devices, and fingerprint readers.

7. The method as claimed in claim 1, wherein said other component is selected from the group comprising display devices, sound generation devices, sound input devices, and fingerprint readers.

8. The method of claim 1, wherein introducing and attaching the second module to the card body is conducted so that the external face of the support is flush with the face of the card body which is opposite the face of the card body through which the face of the component is accessible from the outside.

9. A smart card comprising:
a card body having two opposing faces defining two opposing external faces of the smart card and in which at least two cavities are formed, one of the cavities being a through-cavity extending from one to the other of the opposing faces of the card body and provided with a shoulder oriented towards a predetermined one of the two opposing faces of the card body, another one of the cavities being a blind cavity extending from one of the two opposing faces of the card body;
a first module comprising a chip and attached in the blind cavity; and
a second module comprising the other electronic component having a face that is accessible from the outside of the smart card and a support having an internal face to which the electronic component is attached opposite the face thereof that is accessible and an external face opposite the internal face, the second module being attached in the through-cavity by the shoulder, the predetermined face being opposite that where said face of the component is accessible with the external face of the support, the predetermined face of the card body defining one of the external faces of the smart card.

10. The smart card as claimed in claim 9, wherein the card body integrates, between the faces of the card body, an inlay comprising conductive tracks, each of the through-cavity and the blind cavity comprising a shoulder surfacing on one face of the inlay, each of the modules being attached to these shoulders to establish electrical connections between the modules and the inlay.

11. The smart card as claimed in claim 10, wherein the modules are attached to the inlay to establish said electrical connections on opposite faces of said inlay.

12. The smart card as claimed in claim 11, wherein the inlay comprises an antenna.

13. The smart card as claimed in claim 10, wherein the inlay comprises an antenna.

14. The smart card as claimed in claim 9, wherein said other component is selected from the group comprising display devices, sound generation devices, sound input devices, and fingerprint readers.

15. The smart card of claim 9, wherein the external face of the support is flush with the predetermined face of the card body.

16. A method for producing a smart card including at least one chip and at least one other electronic component having a face that is accessible from the outside of the smart card, the method comprising:
a step of forming a card body provided with two opposing first and second faces defining first and second faces of the smart card and at least two cavities, one of the at least two cavities being a through-cavity extending from one to the other of the two opposing first and second faces, the through-cavity being provided with a shoulder, another one one of the cavities being a blind cavity extending from one of the two opposing first and second faces;
a step of forming a first module comprising a chip;
a step of forming a second module separate from the first module, the second module comprising the other electronic component, the second module further comprising a support having an internal face to which the other electronic component is attached opposite the face thereof that is accessible and an external face opposite the internal face;
after the step of forming the card body and the step of forming the second module, a step of attaching the second module in the through-cavity from the face of the body which is opposite the face of the card body through which the face of the component is accessible from the outside by the shoulder that comprises the through-cavity, the external face of the support of the second module defining, with the face of the card body that is opposite the face of the card body through which the face of the component is accessible from the outside, an external face of the smart card; and
after the step of forming the card body and the step of forming the first module, a step of attaching the first module in the blind cavity.

17. The method of claim 16, wherein the step of attaching the second module to the card body is conducted so that the external face of the support is flush with the face of the card body which is opposite the face of the card body through which the face of the component is accessible from the outside.

* * * * *